US012584946B2

(12) United States Patent
Su et al.

(10) Patent No.: US 12,584,946 B2
(45) Date of Patent: Mar. 24, 2026

(54) SOURCE MEASURE DEVICE

(71) Applicant: CHROMA ATE INC., Taoyuan (TW)

(72) Inventors: Jyun-Yi Su, Taoyuan (TW);
Sheng-Shiuan Jian, Taoyuan (TW);
Ting-Ting Chang, Taoyuan (TW);
Wen-Yue Chuang, Taoyuan (TW)

(73) Assignee: CHROMA ATE INC., Taoyuan City (TW)

( * ) Notice: Subject to any disclaimer, the term of this patent is extended or adjusted under 35 U.S.C. 154(b) by 138 days.

(21) Appl. No.: 18/395,276

(22) Filed: Dec. 22, 2023

(65) Prior Publication Data

US 2024/0219435 A1 Jul. 4, 2024

(30) Foreign Application Priority Data

Dec. 30, 2022 (TW) .................................. 111150956

(51) Int. Cl.
G01R 19/165 (2006.01)
(52) U.S. Cl.
CPC .............................. G01R 19/16566 (2013.01)
(58) Field of Classification Search
None
See application file for complete search history.

(56) References Cited

U.S. PATENT DOCUMENTS

| | | | | | |
|---|---|---|---|---|---|
| 7,538,539 | B1 * | 5/2009 | Balke | ..................... | G01R 15/08 |
| | | | | | 324/123 R |
| 8,456,338 | B2 * | 6/2013 | Regier | ............... | G01R 31/3004 |
| | | | | | 341/142 |
| 8,704,525 | B2 * | 4/2014 | Lyles | ................... | G01R 31/396 |
| | | | | | 324/433 |
| 9,910,074 | B2 * | 3/2018 | Lindell | .............. | G01R 19/0053 |
| 11,460,506 | B2 * | 10/2022 | Kim | ...................... | G01R 31/382 |
| 11,619,666 | B1 * | 4/2023 | Iwaki | ................. | G01R 31/3004 |
| | | | | | 324/750.01 |
| 12,306,209 | B2 * | 5/2025 | Goeke | .............. | G01R 31/31924 |
| 12,308,689 | B2 * | 5/2025 | Cha | ......................... | B60L 58/12 |
| 2010/0023285 | A1 * | 1/2010 | Nakanishi | .......... | G01R 31/3835 |
| | | | | | 702/179 |

(Continued)

FOREIGN PATENT DOCUMENTS

| | | |
|---|---|---|
| CN | 106814311 A | 6/2017 |
| CN | 111796154 A | 10/2020 |

(Continued)

*Primary Examiner* — Richard Isla
(74) *Attorney, Agent, or Firm* — CKC & Partners Co., LLC

(57) ABSTRACT

A source measure device includes a current sampling circuit, a voltage sampling circuit, an overvoltage detecting circuit, and a comparing circuit. The current sampling circuit is configured to sample a current of a device under test. The voltage sampling circuit is configured to sample a voltage of the device under test. The overvoltage detecting circuit is coupled to the current sampling circuit and the voltage sampling circuit, and receives a first operation voltage of the current sampling circuit and a second operation voltage of the voltage sampling circuit so as to generate a detection voltage. The comparing circuit is coupled to the overvoltage detecting circuit, and determines whether the detection voltage is within a voltage range. If the detection voltage is not within the voltage range, the comparing circuit generates an abnormal signal.

10 Claims, 4 Drawing Sheets

(56) References Cited

U.S. PATENT DOCUMENTS

| 2012/0253714 A1* | 10/2012 | Vilhauer | G01R 31/3842 |
| | | | 702/63 |
| 2012/0256598 A1 | 10/2012 | Hsu et al. | |
| 2020/0343715 A1 | 10/2020 | Kaeriyama | |

FOREIGN PATENT DOCUMENTS

| CN | 115242601 A | 10/2022 |
| JP | 2004328886 A | 11/2004 |
| JP | 2006275928 A | 10/2006 |
| JP | 2007240450 A | 9/2007 |
| JP | 2013140565 A | 7/2013 |
| JP | 2019161889 A | 9/2019 |
| JP | 2022072682 A | 5/2022 |
| TW | 201304243 A | 1/2013 |
| TW | 201326863 A | 7/2013 |
| TW | 201719998 A | 6/2017 |

* cited by examiner

SOURCE MEASURE DEVICE

CROSS-REFERENCE TO RELATED APPLICATION

This application claims priority to Taiwan Application Serial Number 111150956, filed Dec. 30, 2022, which is herein incorporated by reference in its entirety.

BACKGROUND

Technical Field

The present disclosure relates to a measure device. More particularly, the present disclosure relates to a source measure device.

Description of Related Art

When a general source measure unit (SMU) outputs a force voltage (FV), a sensing path in a four-wire type will be independent of an output main voltage path to connect to the device under test (DUT) nearby. However, if the sensing path is disconnected from the DUT due to conditions such as incorrect overlapping or vibration, etc., the measure voltage (MV) will be invalid, and the system will enter an open circuit state, which may cause overvoltage damage to the DUT.

In addition, existing technology uses a voltage of a voltage sampling circuit as a basis for an abnormality detection circuit to confirm whether the DUT is abnormal. However, if the sensing path is disconnected from the DUT due to conditions such as incorrect overlapping or vibration, etc., the voltage of the voltage sampling circuit may not be obtained, which may cause the abnormality detection circuit to be unable to operate. Thus, techniques associated with the development for overcoming the problems described above are important issues in the field.

SUMMARY

The summary is intended to provide a simplified summary of the present disclosure so that the reader will have a basic understanding of the present disclosure. The summary is not a complete summary of the present disclosure and is not intended to point out important/critical elements of this embodiment or to define the scope of the present disclosure.

An aspect of the present disclosure is associated with a source measure device. The source measure device includes a current sampling circuit, a voltage sampling circuit, an overvoltage detecting circuit, and a comparing circuit. The current sampling circuit is configured to sample a current of a device under test. The voltage sampling circuit is configured to sample a voltage of the device under test. The overvoltage detecting circuit is coupled to the current sampling circuit and the voltage sampling circuit, and receives a first operation voltage of the current sampling circuit and a second operation voltage of the voltage sampling circuit so as to generate a detection voltage. The comparing circuit is coupled to the overvoltage detecting circuit, and determines whether the detection voltage is within a voltage range. If the detection voltage is not within the voltage range, the comparing circuit generates an abnormal signal.

In some embodiments, the current sampling circuit includes a first input terminal. The first input terminal is coupled to a positive voltage terminal of the device under test.

In some embodiments, the voltage sampling circuit includes a second input terminal and a third input terminal. The second input terminal is coupled to a first sensing terminal of the device under test. The third input terminal is coupled to the second sensing terminal of the device under test. The overvoltage detecting circuit is coupled to the first input terminal of the current sampling circuit and the third input terminal of the voltage sampling circuit.

In some embodiments, when the second input terminal of the voltage sampling circuit is disconnected from the first sensing terminal of the device under test, the overvoltage detecting circuit receives the first operation voltage of the first input terminal of the current sampling circuit and the second operation voltage of the third input terminal of the voltage sampling circuit so as to generate the detection voltage.

In some embodiments, the current sampling circuit further includes a fourth input terminal and a first subtractor. The fourth input terminal is coupled to the positive voltage terminal of the device under test through a resistor. The first subtractor is coupled to the first input terminal and the fourth input terminal.

In some embodiments, the voltage sampling circuit further includes a second subtractor. The second subtractor is coupled to the second input terminal and the third input terminal.

In some embodiments, the overvoltage detecting circuit includes a subtractor. The subtractor is configured to compare the first operation voltage of the current sampling circuit and the second operation voltage of the voltage sampling circuit so as to generate the detection voltage.

In some embodiments, the source measure device further includes an output circuit and a control circuit. The output circuit is coupled to the device under test. The control circuit is coupled to the output circuit, and is configured to control the output circuit to stop outputting voltage to the device under test according to the abnormal signal.

In some embodiments, the control circuit is further configured to control the output circuit to output a minimum current according to the abnormal signal.

In some embodiments, the control circuit records the device under test corresponding to the abnormal signal in a database.

Therefore, according to the technical content of the present disclosure, the source measure device shown in the embodiments of the present disclosure can receive different operation voltages from the current sampling circuit and the voltage sampling circuit respectively through the overvoltage detecting circuit. In this way, even when the voltage sampling circuit and the device under test are disconnected, the overvoltage detecting circuit of the present disclosure can still accurately receives the operation voltage so as to generate the detection voltage. Then the comparing circuit determines whether the device under test is abnormal or not according to the detection voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
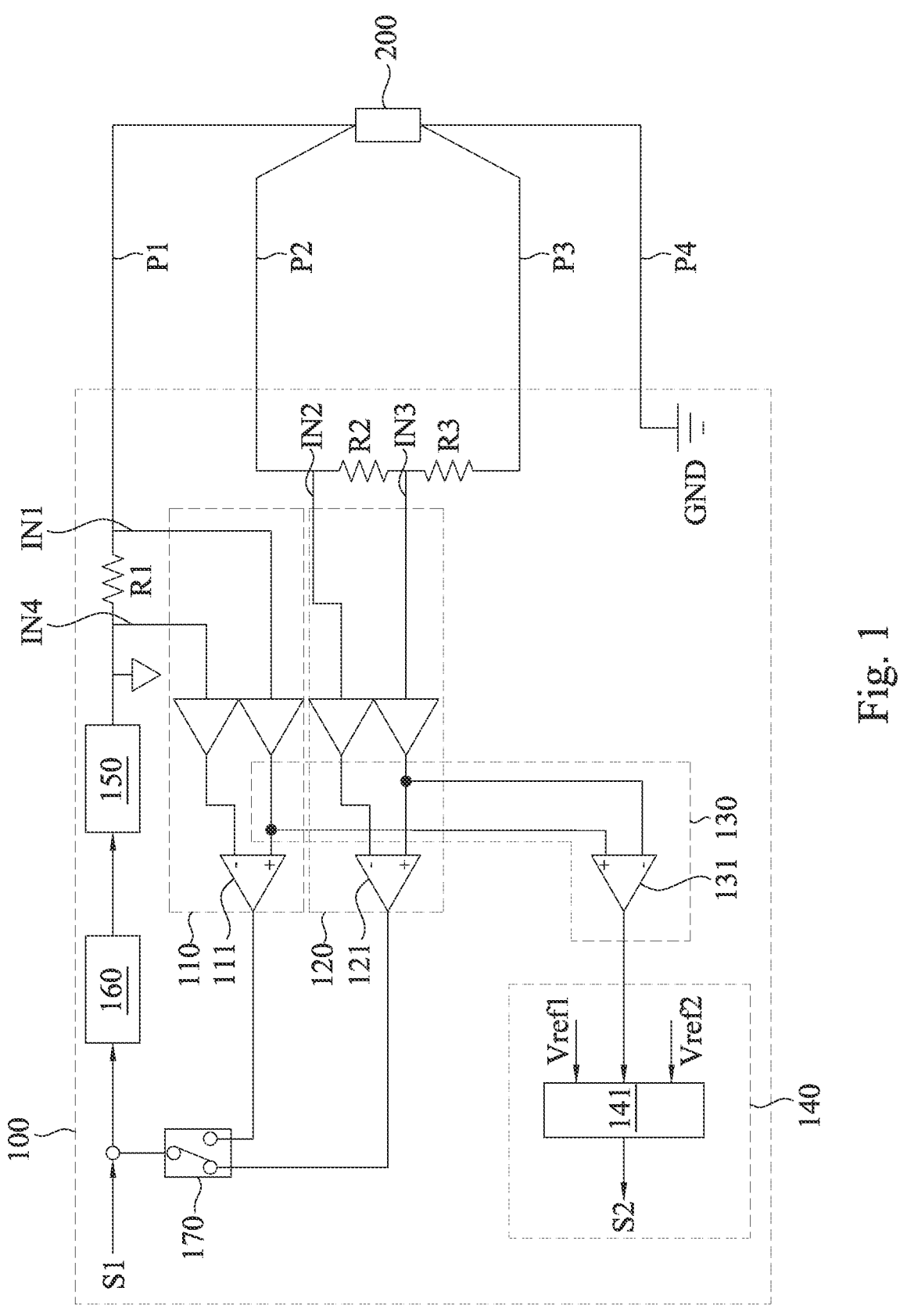
FIG. 1 is a schematic diagram of a source measure device and a device under test illustrated according to some embodiments of present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a schematic diagram of a source measure device 100 and a device under test 200 illustrated according to some embodiments of present disclosure. As illustratively shown in FIG. 1, the source measure device 100 includes a current sampling circuit 110, a voltage sampling circuit 120, an overvoltage detecting circuit 130 and a comparing circuit 140. Structurally, the overvoltage detecting circuit 130 is coupled to the current sampling circuit 110 and the voltage sampling circuit 120, and the comparing circuit 140 is coupled to the overvoltage detecting circuit 130.

Operationally, the current sampling circuit 110 is configured to sample a current of a device under test 200. The voltage sampling circuit 120 is configured to sample a voltage of the device under test 200. Subsequently, the overvoltage detecting circuit 130 receives a first operation voltage of the current sampling circuit 110 and a second operation voltage of the voltage sampling circuit 120 so as to generate a detection voltage. Then the comparing circuit 140 determines the detection voltage whether is within a voltage range. If the detection voltage is not within the voltage range, meaning that the device under test 200 is abnormal, the comparing circuit 140 generates an abnormal signal S2.

In some embodiments, the current sampling circuit 110 includes a first input terminal IN1, the first input terminal IN1 is coupled to the device under test 200 through a positive voltage terminal P1 of the source measure device 100. In other embodiments, the voltage sampling circuit 120 includes a second input terminal IN2 and a third input terminal IN3. The second input terminal IN2 is coupled to the device under test 200 through the first sensing terminal P2 of the source measure device 100. The third input terminal IN3 is coupled to the device under test 200 through the second sensing terminal P3 of the source measure device 100. The negative voltage terminal P4 of the source measure device 100 is connected to ground. The overvoltage detecting circuit 130 is coupled to the first input terminal IN1 of the current sampling circuit 110 and the third input terminal IN3 of the voltage sampling circuit 120.

In some embodiments, the source measure device 100 further includes an output circuit 150 and a control circuit 160. The output circuit 150 is coupled to the device under test 200 through a resistor R1 and the positive voltage terminal P1. The control circuit 160 is coupled to the output circuit 150, and is configured to control the output circuit 150 to stop outputting voltage to the device under test 200 according to the abnormal signal S2. In other words, the output voltage is set to 0 V to avoid damage. Additionally, the control circuit 160 sets the output voltage to 0 V by the slowest gear of switching bandwidth so as to slowly decrease the voltage to 0 V in a stepwise manner. Assuming that the slowest gear of switching bandwidth is 0.1 V, the control circuit 160 decreases the output voltage from 1 V by 0.1 V to 0.9 V, and then decreases the output voltage from 0.9 V by 0.1 V to 0.8 V, . . . , until the output voltage decreases to 0 V. Such a gradual decreasing approach can avoid component damage caused by instant overshoot or undershoot due to excessive voltage changes.

In other embodiments, the source measure device 100 further includes a switch 170. The switch 170 is configured to switch between the current sampling circuit 110 and the voltage sampling circuit 120, so as to couple the current sampling circuit 110 or the voltage sampling circuit 120 to the control circuit 160.

Figure 2:
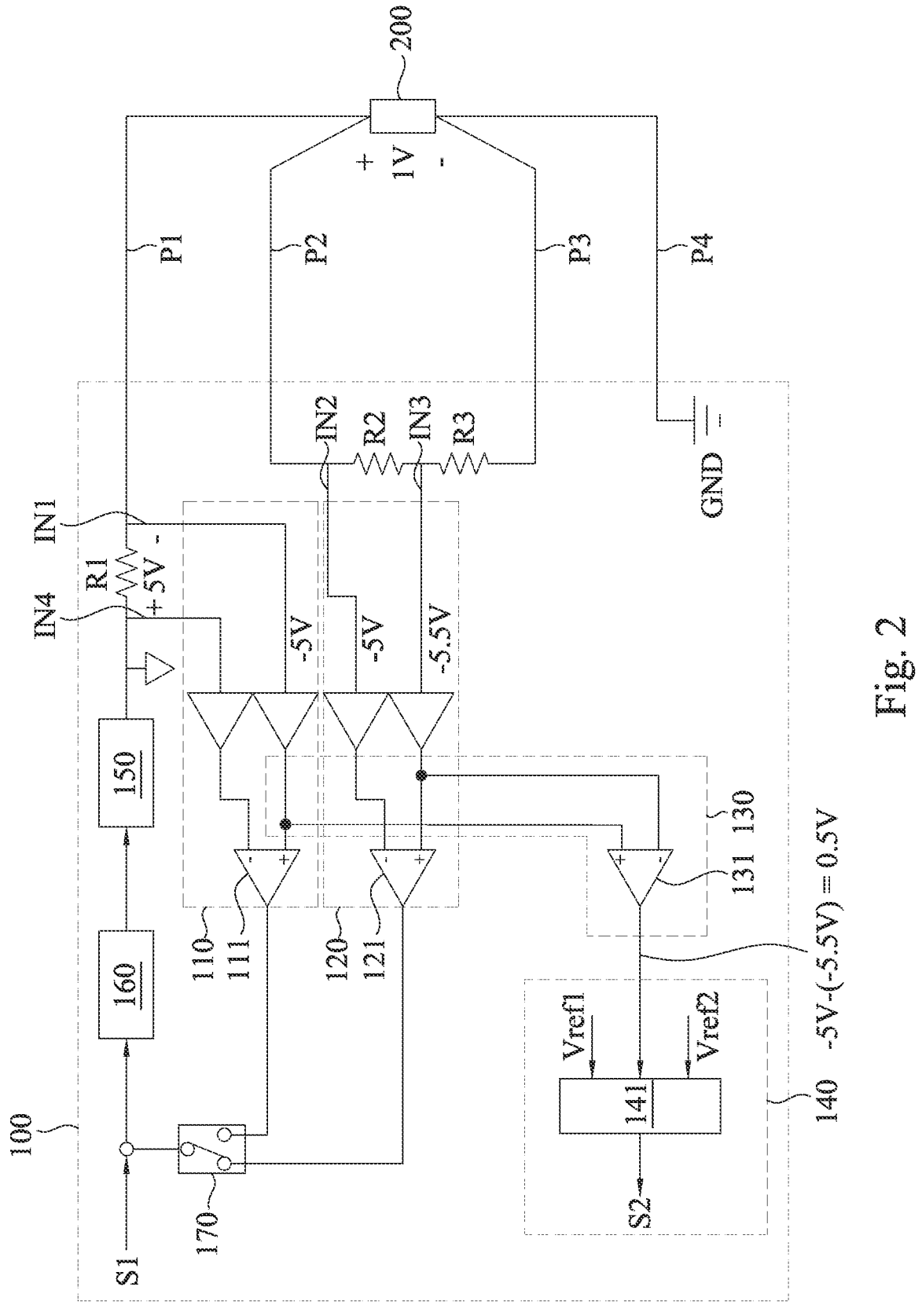
FIG. 2 is a schematic diagram of an operation of a source measure device and a device under test illustrated according to some embodiments of present disclosure.
Figure 3:
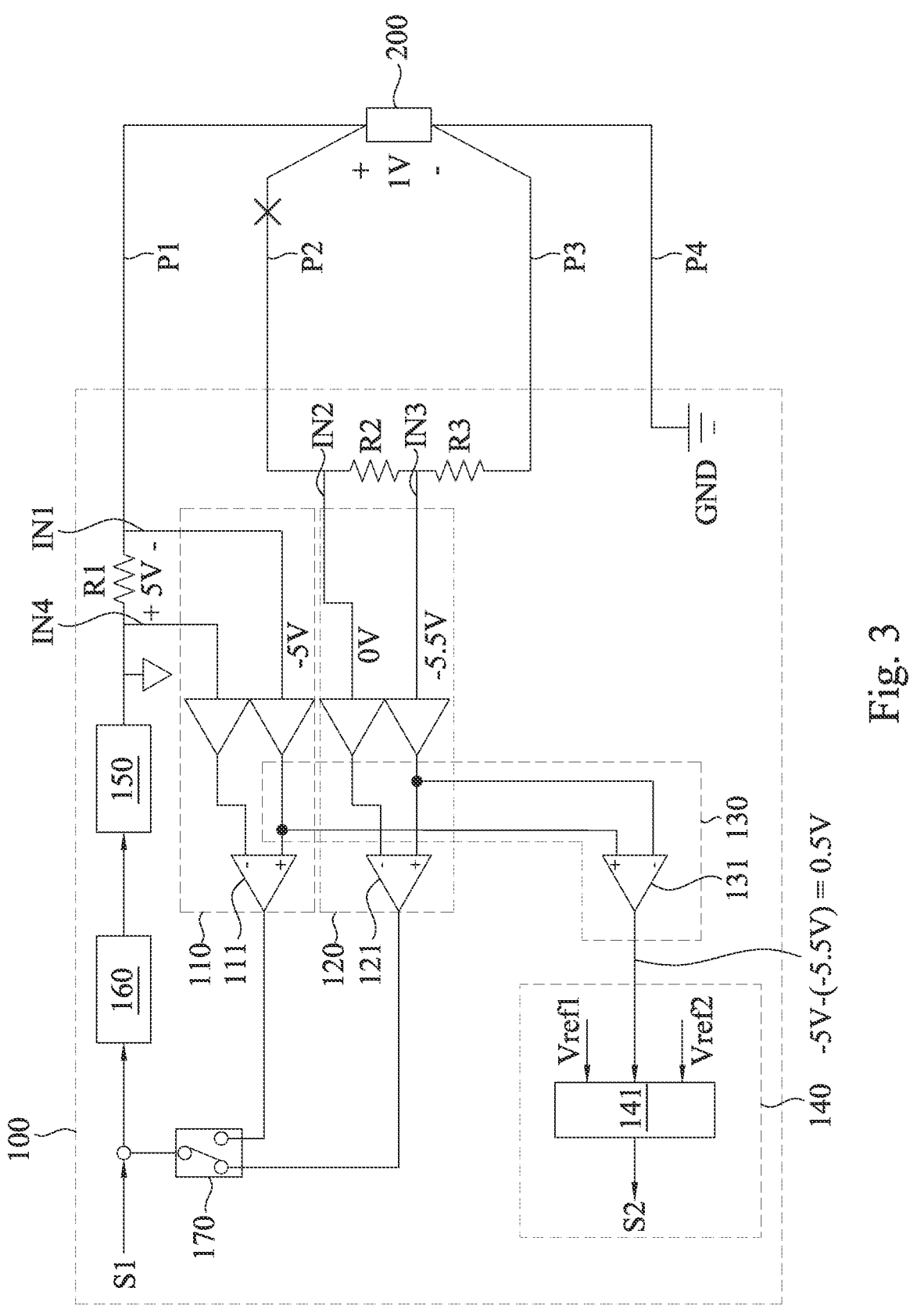
FIG. 3 is a schematic diagram of an operation of a source measure device and a device under test illustrated according to some embodiments of present disclosure.

In order to make the operation of the source measure device 100 of the present disclosure easy to understand, please refer to FIG. 2 and FIG. 3 together, which are schematic diagrams of operations of the source measure device 100 and the device under test 200 illustrated according to some embodiments of present disclosure. As illustratively shown in FIG. 2, assuming that the set voltage S1 is 0.5 V, after receiving the set voltage, the control circuit 160 will control the output circuit 150 to output a current of 10 mA to the positive voltage terminal P1. At this time, the first input terminal IN1 of the current sampling circuit 110 samples a voltage of –5 V, and the voltage across the device under test 200 is 1 V. After the voltage across the device under test 200 is divided by the resistors R2 and R3, the voltage sampled at the second input terminal IN2 of the voltage sampling circuit 120 is –5 V, and the voltage sampled at the third input IN3 is –5.5 V.

When the source measure device 100 operates normally, the overvoltage detecting circuit 130 can normally receive a voltage of –5 V sampled at the first input terminal IN1 of the current sampling circuit 110 and a voltage of –5.5 V sampled at the third input terminal IN3 of the voltage sampling circuit 120 so as to generate the detection voltage with a voltage of 0.5 V. The voltage range set by the comparing circuit 140 may be, but is not limited to, between the 2.5 V of a default voltage Vref1 and the –2.5 V of a default voltage Vref2. Since the detection voltage provided by the overvoltage detecting circuit 130 is 0.5 V, which is within the voltage range mentioned above, the comparing circuit 140 determines that the device under test 200 is normal, and does not generate the abnormal signal S2.

In other cases, if the detection voltage provided by the overvoltage detecting circuit 130 is, for example, 3V, which is not within the voltage range (–2.5 V to 2.5 V) mentioned above, the comparing circuit 140 determines that the device under test 200 is abnormal, and generates the abnormal signal S2.

Please refer to FIG. 3, also assuming that the set voltage S1 is 0.5 V, after receiving the set voltage, the control circuit 160 controls the output circuit 150 to output a current of 10 mA to the positive voltage terminal P1. The voltage sampled at the first input terminal IN1 of the current sampling circuit 110 is –5 V, and the voltage across the device under test 200 is 1 V. At this time, even if the second input terminal IN2 of the voltage sampling circuit 120 and the device under test 200 are suddenly disconnected, the voltage sampling circuit 120 can still sample the voltage of –5.5 V through the third input terminal IN3.

Subsequently, the overvoltage detecting circuit 130 receives a –5 V voltage sampled at the first input terminal IN1 of the current sampling circuit 110 and a voltage –5.5 V sampled at the third input terminal IN3 of the voltage sampling circuit 120 so as to generate the detection voltage of 0.5 V. Then, it is determined whether the abnormal signal is generated or not through subsequent related operations of the comparing circuit 140. As can be seen, the source measure device 100 of present disclosure can receive different operation voltages from the current sampling circuit 110 and the voltage sampling circuit 120 respectively through the overvoltage detecting circuit 130. Therefore, even when part of the circuit of the voltage sampling circuit 120 and the device under test 200 are disconnected, the overvoltage detecting circuit 130 of present disclosure can still receive the operation voltage accurately so as to generate the detection voltage. Then the comparing circuit 140 determines whether the device under test 200 is abnormal or not according to the detection voltage.

In some embodiments, the current sampling circuit 110 further includes a fourth input terminal IN4 and a first subtractor 111. The fourth input terminal IN4 is coupled to the positive voltage terminal P1 of the device under test 200 through the resistor R1. The first subtractor 111 is coupled to the first input terminal IN1 and the fourth input terminal IN4. In other embodiments, the resistor R1 may be, but is not limited to, 500 ohms.

In some embodiments, the voltage sampling circuit 120 further includes a second subtractor 121. The second subtractor 121 is coupled to the second input terminal IN2 and the third input terminal IN3. In other embodiments, the comparing circuit 140 includes a comparator 141. The comparator 141 is configured to receive and compare the detection voltage and the default voltages Vref1, Vref2.

In some embodiments, the overvoltage detecting circuit 130 includes a subtractor 131. The subtractor 131 is configured to compare the first operation voltage of the current sampling circuit 110 and the second operation voltage of the voltage sampling circuit 120 so as to generate the detection voltage.

In some embodiments, the control circuit 160 is further configured to control the output circuit 150 to output the minimum current according to the abnormal signal, and to set the switching bandwidth to the slowest gear, so as to avoid component damage caused by instant overshoot or undershoot due to rapid electrical changes.

In some embodiments, the control circuit 160 records the device under test 200 corresponding to the abnormal signal in a database (not shown in the figure). It should be noted that in actual operations of present disclosure, a large number of the device under test 200 can be measured at one time. If some of the devices under test 200 have abnormal situations and generate the abnormal signals, the control circuit 160 of present disclosure can record the devices under test 200 in the database so that the user knows which of the devices under test 200 are abnormal. In other embodiments, the resistance of the device under test 200 may be, but is not limited to, 100 ohms. In some embodiments, the resistance of the resistors R2, R3 may be, but are not limited to, 10 k ohms.

It should be noted that the present disclosure is not limited to the structures, operations and voltages shown in FIG. 1, FIG. 2 and FIG. 3, which is merely configured to exemplarily illustrate one of the implemented ways of the present disclosure, so as to make the technology of the present disclosure easy to understand. The patent scope of the present disclosure shall be based on the scope of the following claims. The modifications and embellishments to the embodiments of the present disclosure made by those skilled in the art without departing from the spirit of the present disclosure will still fall within the scope of the following claims.

Figure 4:
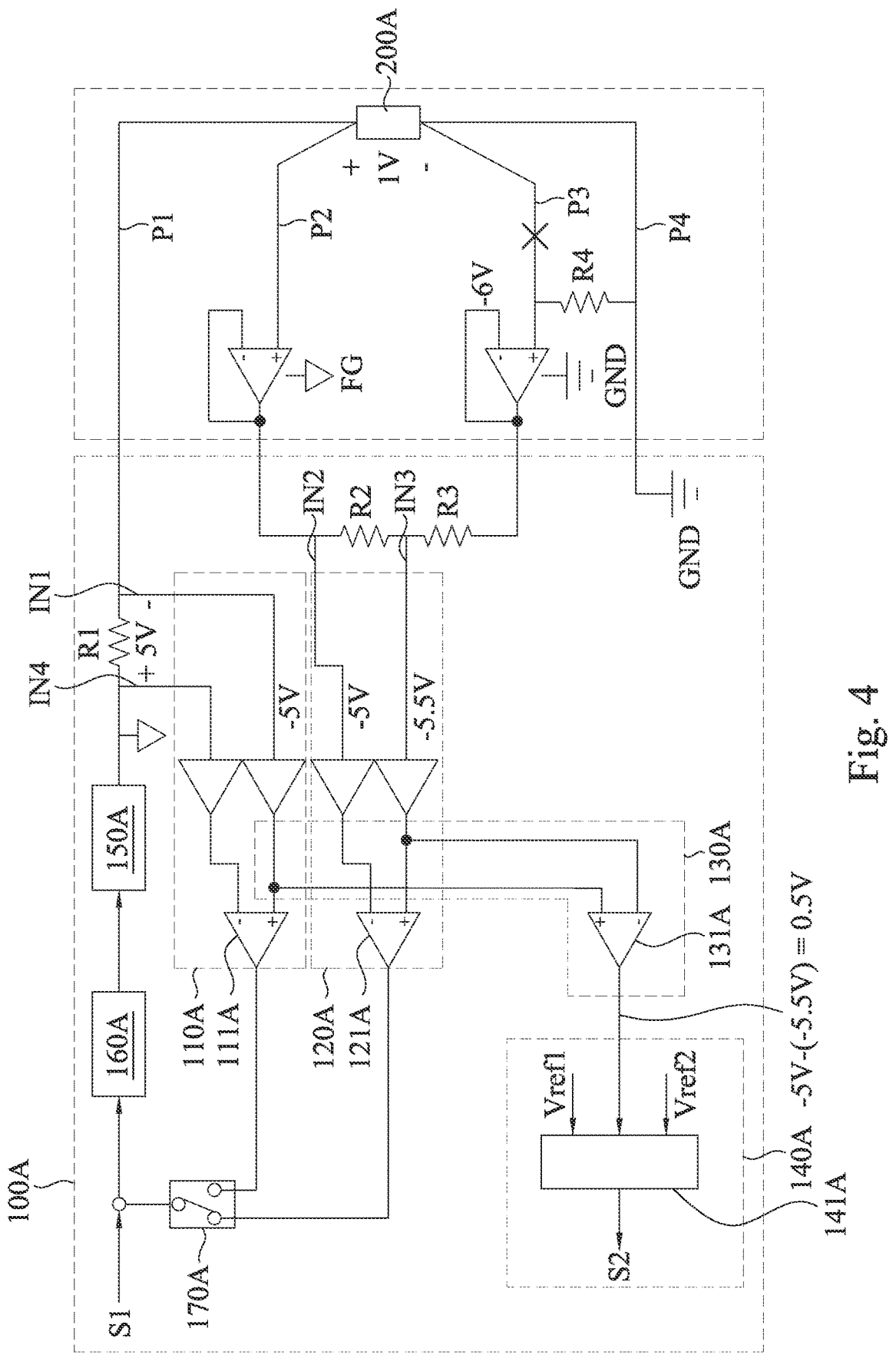
FIG. 4 is a schematic diagram of an operation of a source measure device and a device under test illustrated according to other embodiments of present disclosure.

FIG. 4 is a schematic diagram of an operation of the source measure device 100A and the device under test 200A illustrated according to other embodiments of present disclosure. As illustratively shown in FIG. 4, also assuming that the set voltage S1 is 0.5 V, after receiving the set voltage, the control circuit 160A controls the output circuit 150A to output a current of 10 mA to the positive voltage terminal P1. The voltage sampled at the first input terminal IN1 of the current sampling circuit 110A is −5 V, and the voltage across the device under test 200A is 1 V. At this time, even if the second sensing terminal P3 is suddenly disconnected, the third input terminal IN3 and the device under test 200A can still sample the negative voltage through the resistor R4 and the negative voltage terminal P4 path, and the voltage sampling circuit 120A can still sample the voltage of −5.5 V.

Subsequently, the overvoltage detecting circuit 130A receives the voltage of −5 V sampled at the first input terminal IN1 of the current sampling circuit 110A and the voltage of −5.5 V sampled at the third input terminal IN3 of the voltage sampling circuit 120A so as to generate the detection voltage of 0.5 V. Then, it is determined whether the abnormal signal is generated or not through subsequent related operations of the comparing circuit 140A.

In some embodiments, the resistance of the resistor R4 may be, but is not limited to, 100k ohms. It should be noted that the present disclosure is not limited to the structures, operations and voltages shown in FIG. 4, which is merely configured to exemplarily illustrate one of the implemented ways of the present disclosure, so as to make the technology of the present disclosure easy to understand. The patent scope of the present disclosure shall be based on the scope of the following claims. The modifications and embellishments to the embodiments of the present disclosure made by those skilled in the art without departing from the spirit of the present disclosure will still fall within the scope of the following claims.

It can be seen from the embodiments of the present disclosure mentioned above that the application of present disclosure has the following advantages. The source measure device shown in the embodiments of the present disclosure can receive different operation voltages from the current sampling circuit and the voltage sampling circuit respectively through the overvoltage detecting circuit. In this way, even when the voltage sampling circuit and the device under test are disconnected, the overvoltage detecting circuit of the present disclosure can still accurately receives the operation voltage so as to generate the detection voltage. Then the comparing circuit determines whether the device under test is abnormal or not according to the detection voltage.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of present disclosure provided they fall within the scope of the following claims.

What is claimed is:

1. A source measure device, comprising:
a current sampling circuit coupled to a first terminal of a device under test and configured to sample a current provided to the first terminal of the device under test;
a voltage sampling circuit coupled to the device under test through a first sensing terminal and a second sensing terminal and configured to sample a voltage across the first sensing terminal and the second sensing terminal;

an overvoltage detecting circuit coupled to the current sampling circuit and the voltage sampling circuit, and receiving a first operation voltage and a second operation voltage to generate a detection voltage, wherein the first operation voltage is generated by the current sampled by the current sampling circuit following a first resistor, and the second operation voltage is generated based on the voltage sampled by the voltage sampling circuit 1; and
a comparing circuit coupled to the overvoltage detecting circuit, and determining whether the detection voltage is within a voltage range, if the detection voltage is not within the voltage range, the comparing circuit generates an abnormal signal.

2. The source measure device of claim 1, wherein the current sampling circuit comprises:
a first input terminal coupled to the first terminal of the device under test.

3. The source measure device of claim 2, wherein the voltage sampling circuit comprises:
a second input terminal coupled to the device under test through the first sensing terminal; and
a third input terminal coupled to the device under test through the second sensing terminal;
wherein the overvoltage detecting circuit is coupled to the first input terminal of the current sampling circuit and the third input terminal of the voltage sampling circuit.

4. The source measure device of claim 3, wherein when the second input terminal of the voltage sampling circuit is disconnected from the device under test, the overvoltage detecting circuit receives the first operation voltage of the first input terminal of the current sampling circuit and the second operation voltage of the third input terminal of the voltage sampling circuit so as to generate the detection voltage.

5. The source measure device of claim 4, wherein the current sampling circuit further comprises:
a fourth input terminal coupled to the first input terminal through the first resistor; and
a first subtractor coupled to the first input terminal and the fourth input terminal.

6. The source measure device of claim 5, wherein the voltage sampling circuit further comprises:
a second subtractor coupled to the second input terminal and the third input terminal.

7. The source measure device of claim 1, wherein the overvoltage detecting circuit comprises:
a subtractor configured to compare the first operation voltage of the current sampling circuit and the second operation voltage of the voltage sampling circuit so as to generate the detection voltage.

8. The source measure device of claim 1, further comprising:
an output circuit coupled to the device under test; and
a control circuit coupled to the output circuit and configured to control the output circuit to stop outputting current to the device under test according to the abnormal signal.

9. The source measure device of claim 8, wherein the control circuit is further configured to control the output circuit to output a minimum current according to the abnormal signal.

10. The source measure device of claim 9, wherein the control circuit records the device under test corresponding to the abnormal signal in a database.

* * * * *